United States Patent
Kemper

(10) Patent No.: US 7,672,102 B2
(45) Date of Patent: Mar. 2, 2010

(54) ELECTRICAL OVERSTRESS PROTECTION

(75) Inventor: Wolfgang Kemper, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 34 days.

(21) Appl. No.: 11/964,095

(22) Filed: Dec. 26, 2007

(65) Prior Publication Data

US 2008/0158748 A1 Jul. 3, 2008

Related U.S. Application Data

(60) Provisional application No. 60/883,028, filed on Dec. 31, 2006.

(51) Int. Cl.
*H02H 3/22* (2006.01)
(52) U.S. Cl. ........................................................ 361/56
(58) Field of Classification Search .................. 361/56, 361/111, 101
See application file for complete search history.

(56) References Cited

U.S. PATENT DOCUMENTS

| 5,272,392 | A | * | 12/1993 | Wong et al. ................. 327/109 |
| 5,684,663 | A | * | 11/1997 | Mitter ........................ 361/106 |
| 7,336,459 | B2 | * | 2/2008 | Chen ........................... 361/56 |
| 7,408,751 | B1 | * | 8/2008 | Lien et al. ..................... 361/56 |

| 2003/0223166 | A1 | * | 12/2003 | Chen et al. .................... 361/56 |
| 2005/0200398 | A1 | * | 9/2005 | Arai ........................... 327/427 |
| 2005/0286194 | A1 | * | 12/2005 | Fujiki et al. ................. 361/100 |

FOREIGN PATENT DOCUMENTS

WO    WO 2005/002019 A1    1/2005

OTHER PUBLICATIONS

Benjamin Van Camp, Frederic De Ranter, Bart Keppens, "Current detection trigger for SCR based ESD protection of Output drivers in CMOS technologies avoiding competitive triggering," 2005 EOS/ESD Symposium, US (www.sarnoffeurope.eu/files/File/Papers/CP_ESD2005_RTSCR.pdf).

* cited by examiner

*Primary Examiner*—Stephen W Jackson
*Assistant Examiner*—Angela Brooks
(74) *Attorney, Agent, or Firm*—John J. Patti; Wade J. Brady, III; Frederick J. Telecky, Jr.

(57) ABSTRACT

In one aspect, a method for protection of an integrated circuit device includes but is not limited to detecting a first current in the integrated circuit device, wherein the first current is caused by a second current; and shunting the second current away from the integrated circuit device in response to detecting the first current. Such detecting may include but not be limited to detecting the first current by detecting a voltage drop across a sensing resistor, which may include but not be limited to using at least two sensing transistors. Such shunting may include but not be limited to using at least one shunting transistor.

6 Claims, 4 Drawing Sheets

FIG. 3

| OUTPUT 422 | MP_OUT 418 | MN_OUT 416 | MP_INV 410 | MN_INV 408 | MP1 412 | ESD_CLAMP 424 |
|---|---|---|---|---|---|---|
| HIGH | OFF | ON | ON | OFF | OFF | OFF |
| LOW | ON | OFF | ON | OFF | OFF | OFF |

| MN_OUT 416 | MN_INV 408 | MP_INV 410 | MP1 412 | ESD_CLAMP 424 |
|---|---|---|---|---|
| BREAKDOWN | ON | OFF | ON | ON |

ELECTRICAL OVERSTRESS PROTECTION

This application claims priority under 35 USC §119(e)(1) of Provisional Application No. 60/883,028, filed Dec. 31, 2006, incorporated herein by reference.

FIELD OF THE INVENTION

The present disclosure relates, in general, to integrated circuits. In particular, the present disclosure relates to the protection of integrated circuit devices from damage due to electrical overstress.

BACKGROUND OF THE INVENTION

Integrated circuits and integrated circuit devices, especially sensitive circuits and devices in complementary metal-oxide-semiconductor (herein, "CMOS") technology, may be protected against defects caused by an electrical overstress. An electrical overstress, for example, may cause a voltage that causes a current to flow through a dielectric between two surfaces, where the dielectric is designed to prevent a current flow between the two surfaces, resulting in a short circuit. Such a short circuit may damage the gate oxide/diffusion, the metal layers, or the contacts of the integrated circuit, or cause a junction breakdown, damaging the inter layer junction of a semiconductor. Further, other types of circuits, both digital and analog, require similar protection from electrical overstress.

SUMMARY OF THE INVENTION

In one aspect, a protection circuit for an integrated circuit device includes but is not limited to a sensing resistor for sensing a first current in the integrated circuit device, wherein the first current is caused by a second current; at least two sensing transistors for sensing the first current, wherein each of the at least two sensing transistors includes a sensing transistor gate and a sensing transistor source/drain, and wherein the sensing transistor gate of each of a first sensing transistor and a second sensing transistor of the at least two sensing transistors is operably coupleable to the sensing resistor; and at least one shunting transistor for shunting the second current away from the integrated circuit device, wherein the at least one shunting transistor includes a shunting transistor gate, and wherein the shunting transistor gate is operably coupleable to a sensing transistor source/drain of a sensing transistor of the at least two sensing transistors.

In one aspect, a protection circuit for an integrated circuit device includes but is not limited to a triggering resistor, the triggering resistor operably coupleable to the integrated circuit device, the first current resulting from a second current flowing into the integrated circuit device; at least two triggering transistors for sensing a voltage drop across the triggering resistor, wherein each of the at least two triggering transistors includes a triggering transistor gate and a triggering transistor source/drain, and wherein the triggering transistor gate of each of a first triggering transistor and a second triggering transistor of the at least two triggering transistors is operably coupleable to the triggering resistor; and at least one clamping transistor for clamping the second current away from the integrated circuit device, wherein the at least one clamping transistor includes a clamping transistor gate, and wherein the clamping transistor gate is operably coupleable to a triggering transistor source/drain of a triggering transistor of the at least two triggering transistors.

In one aspect, a method for protection of an integrated circuit device includes but is not limited to detecting a first current in the integrated circuit device, wherein the first current is caused by a second current; and shunting the second current away from the integrated circuit device in response to detecting the first current.

In one aspect, a method for protection of an integrated circuit device includes but is not limited to sensing a voltage drop across a triggering resistor, wherein the voltage drop is a result of a first current from the integrated circuit device flowing through the triggering resistor, wherein the first current is a result of a second current in the integrated circuit device, and wherein the second current is a result of a third current flowing into the integrated circuit device; turning on at least two triggering transistors in response to sensing the voltage drop across the triggering resistor; and turning on at least one clamping transistor in response to a fourth current flowing from at least one of the at least two triggering transistors.

In one or more various aspects, related systems include but are not limited to circuitry or programming for effecting the herein-referenced method aspects; the circuitry or programming can be virtually any combination of hardware, software, or firmware configured to effect the herein-referenced method aspects depending upon the design choices of the designer.

In addition to the foregoing, various other method, device, and system aspects are set forth and described in the teachings such as the text (e.g., claims and detailed description) and drawings of the present disclosure.

The foregoing is a summary and thus contains, by necessity, simplifications, generalizations and omissions of detail; consequently, those skilled in the art will appreciate that the summary is illustrative only and is not intended to be in any way limiting. Other aspects, features, and advantages of the devices, processes, or other subject matter described herein will become apparent in the teachings set forth herein.

Figure 1:
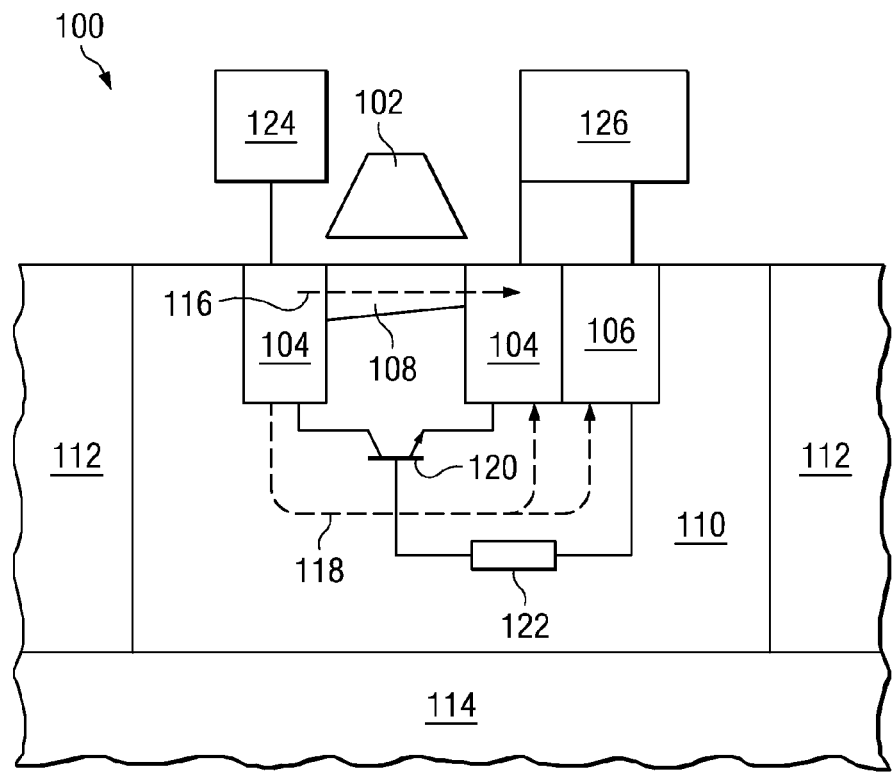
FIG. 1 shows an exemplary integrated circuit device.

While the invention is subject to various modifications and alternative forms, specific embodiments thereof are shown by way of example in the drawings and the accompanying detailed description. It should be understood, however, that the drawings and detailed description are not intended to limit the invention to the particular embodiment. This disclosure is instead intended to cover all modifications, equivalents, and alternatives falling within the scope of the present invention as defined by the appended claims.

Notation and Nomenclature

Certain terms are used throughout the following description and claims to refer to particular system components and configurations. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". Also, the term "couple" or "couples" or "coupleable" is intended to mean either an indirect or direct electrical or wireless connection. Thus, if a first device couples to a second device, that connection may be through a direct electrical or wireless connection, or through an indirect electrical or wireless connection via other devices and connections.

DETAILED DESCRIPTION OF PREFERRED EMBODIMENTS

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

For protection from electrical overstress, one or more specially designed protection circuits may be integrated on the substrates of the circuits and devices to be protected. Such a protection circuit may be activated when a dangerous current or voltage discharge occurs and may switch a shunt or clamp into a low-impedance state to safeguard the sensitive area or areas of the circuit.

FIG. 1 shows an exemplary integrated circuit device 100 when a breakdown current is flowing through its substrate as a result of an electrical overstress and a resulting voltage spike or delta current, such as an electrostatic discharge (herein, "ESD") or a power surge. The exemplary integrated circuit device 100 includes a gate 102, N+ doping regions 104, a P+ doping region 106, an N-channel 108, a P-well 110, N-wells 112, and an N-isolation layer 114. Normal current 116 is the current that flows through the N-channel 108 in the exemplary integrated circuit device 100 in normal operation, with only minimal current (typically, current on the order of $\mu A$) straying into the P-well.

Breakdown current 118 is the current that flows through the exemplary integrated circuit device 100 P-well 110 from one N+ doping region 104 to the other N+ doping region 104 and to the P+ doping region 106. This breakdown current 118 flows under a condition of electrical overstress, but the breakdown current 118 begins when the electrical overstress is at a level below that which will damage the exemplary integrated circuit device 100. The breakdown current 118 may increase to the point at which the exemplary integrated circuit device 100 is damaged. The parasitic NPN transistor 120 is a representation of the parasitic NPN transistor formed by the N+ doping regions 104 and the P-well 110 when a breakdown current flows. Resistance Rw 122 represents the resistance of the P-well 110 when a breakdown current flows. The exemplary integrated circuit device 100 may be connected to a pad 124 and a source 126.

Figure 2:
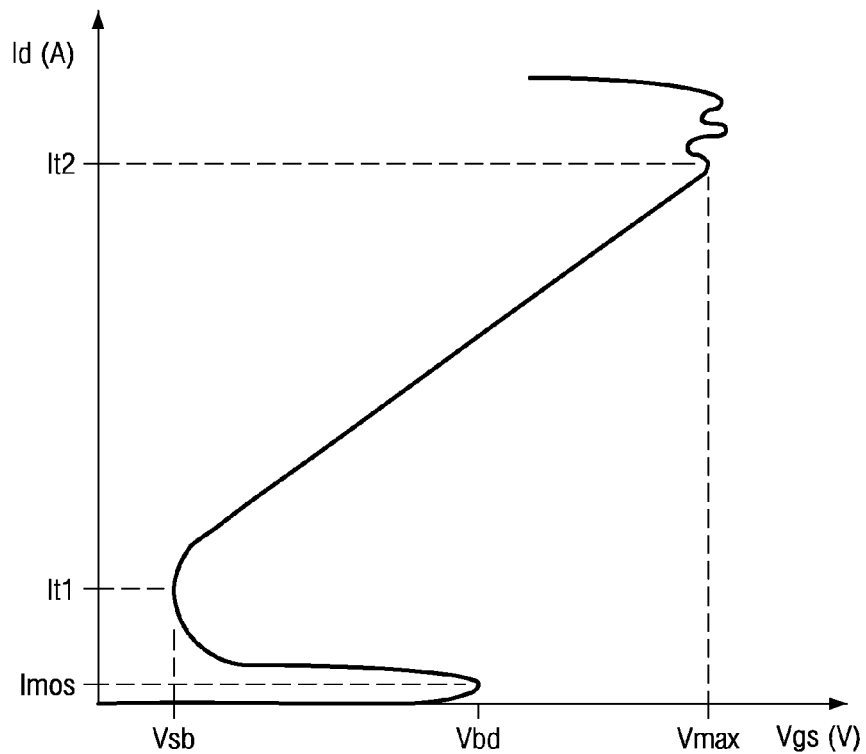
FIG. 2 depicts a graph showing current versus voltage behavior in an exemplary integrated circuit device.

FIG. 2 depicts a graph showing the current Id versus voltage Vgs curve of breakdown in an exemplary n-type CMOS transistor (herein, "NMOST"), such as the exemplary integrated circuit device 100. The exemplary integrated circuit device 100 will operate normally when subjected to an electrical overstress voltage spike until a breakdown voltage Vbd is reached. With reference to FIG. 1, this breakdown voltage Vdb is between one N+ doping region 104 on the one hand and, on the other hand, the P+ doping region 106 and the second N+ doping region 104 through the P-well 110 of FIG. 1, i.e., between the N+ doping regions of the parasitic NPN transistor 120 described in connection with FIG. 1. The current Imos is the amount of current the exemplary integrated circuit device 100 will handle until breakdown voltage Vbd is reached. The current flow in the P-well 110 of the exemplary integrated circuit device 100 will increase as a result of the voltage increasing toward breakdown voltage Vbd from the electrical overstress voltage spike, turning on a parasitic NPN transistor 120 of the exemplary integrated circuit device 100. The parasitic NPN transistor 120, having a much lower resistance than the exemplary integrated circuit device 100, will cause the voltage across the parasitic NPN transistor 120 will "snap back" from the voltage Vdb to snapback voltage Vsb. The current It1 is the current through the P-well 100 from the one N+ doping region 104 on the one hand and, on the other hand, the P+ doping region 106 and the second N+ doping region 104 of FIG. 1 required to keep the parasitic NPN transistor 120 turned on under this condition, and this current It1 will be provided to the exemplary integrated circuit device 100 and will increase as the electrical overstress voltage spike increases. Without protection, the current through the exemplary integrated circuit device 100 will continue to increase until local thermal overstress causes damage within the exemplary integrated circuit device 100 at the breakdown current It2 and voltage Vmax. A typical current It2 is approximately 1-2 mA/$\mu m$, where the distance measured in $\mu m$ is the width W of the transistor with the length L of the transistor assumed to be a minimal length. With reference to FIG. 1, the width W of the transistor is the dimension perpendicular to the cross-section depicted, and the length L is the size of the side of the gate 102 closest to the N+ doping regions 104.

A protective circuit or device that clamps or shunts the electrical overstress voltage spike is described herein that protects the exemplary integrated circuit device 100 from damage caused by the electrical overstress voltage spike. The described protective circuit or device protects the exemplary integrated circuit device 100 when the current through the exemplary integrated circuit device 100 is between current values of Imos and It2.

The reaction time of the electrical overstress clamping transistor or shunting transistor must be less than the time it would take for an electrical overstress pulse to rise to a damaging level, typically 1.5 ns. For sub-micron CMOS processes, the typical run-time, that is, the time it takes for a CMOS transistor to turn on or off, is less than 1.0 ns. An exemplary CMOS electrical overstress clamping transistor or shunting transistor is therefore able to operate to clamp or shunt the electrical overstress voltage within the time requirements imposed by a requirement to keep the current below It2 and the voltage below Vmax to prevent damage to the exemplary integrated circuit device 100 to be protected.

Figure 3:
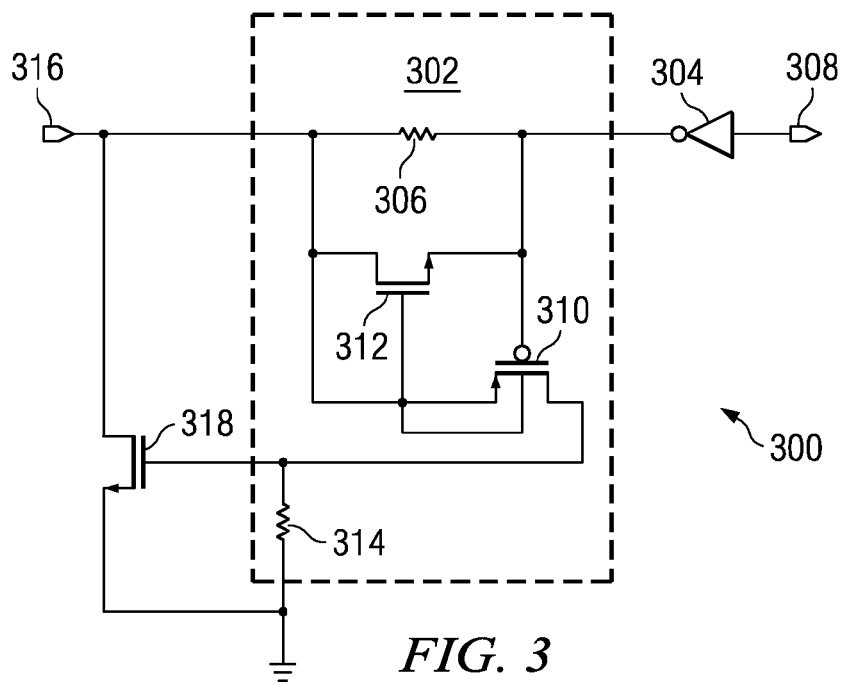
FIG. 3 shows an exemplary integrated circuit.

FIG. 3 shows an exemplary integrated circuit 300 including an exemplary device embodiment. The exemplary integrated circuit 300 includes circuit 302 and an exemplary integrated circuit device INV1 304 which is protected by the circuit 302. The exemplary integrated circuit device INV1 304 may include an integrated circuit device such as the exemplary integrated circuit device 100. The exemplary integrated circuit device INV1 304 may represent one or more integrated circuits or integrated circuit devices to be protected. The circuit 302 includes but is not limited to a resistor R_SENSE 306, a transistor MP1 310, a transistor MNMIR1 312, and a resistor R_PULLDOWN 314. The circuit 302 is operably coupled to a pad 316, the exemplary integrated circuit device INV1 304 (which is operably connected to an output 308) and a transistor ESD_SHUNT 318.

During normal operation of the circuit 302, the resistor R_PULLDOWN 314 holds the gate of the transistor ESD_SHUNT 318 to a low voltage, such that the transistor ESD_SHUNT 318 is off and current from the pad 316 flows through the resistor R_SENSE 306 to the circuit 302 and to the integrated circuit device INV1 304. When an electrical overstress voltage spike is applied to the pad 316, the increased current flows through the resistor R_SENSE 306, causing an increased voltage drop across the resistor R_SENSE 306. This increase voltage drop now also exists between the gate and the source of the transistor MNMIR 312, and it is turned on and pulls the voltage at the gate of the transistor MP1 310 low, turning on the transistor MP1 310. When the transistor MP1 310 is turned on, a high voltage is applied to the gate of ESD_SHUNT 318. The transistor ESD_ SHUNT 318 is turned on when a voltage is applied to its gate, allowing the electrical overstress current to flow from the pad 316 through the transistor ESD_SHUNT 318 to ground. Thus, turning on the transistor ESD_SHUNT 318 shunts the ESD voltage spike to a reference voltage, e.g., ground.

The resistance of the resistor R_SENSE 306 is chosen to permit normal operation of the exemplary integrated circuit device INV1 304 without significant impact. At the same time, the resistance of the resistor R_SENSE 306 is chosen such that the resistor R_SENSE 306 can sense an electrical overstress voltage spike applied to the pad 316 while the exemplary integrated circuit device INV1 304 is experiencing a breakdown current but before the current through exemplary integrated circuit device INV1 304 is sufficiently high to damage INV1 304.

A current or voltage spike resulting from an electrical overstress in an integrated circuit device may include but is not limited to an ESD current or voltage spike as described in connection with FIG. 1. An electrical overstress current or voltage spike may also be caused by, e.g., a power surge. The transistor ESD_SHUNT 318 may shunt or clamp a current or voltage spike resulting from electrical overstress; it is not limited to clamping or shunting an ESD current or voltage spike. Those skilled in the art will appreciate that embodiments may include but are not limited to CMOS and bipolar junction integrated circuit devices and applications.

Figure 4:
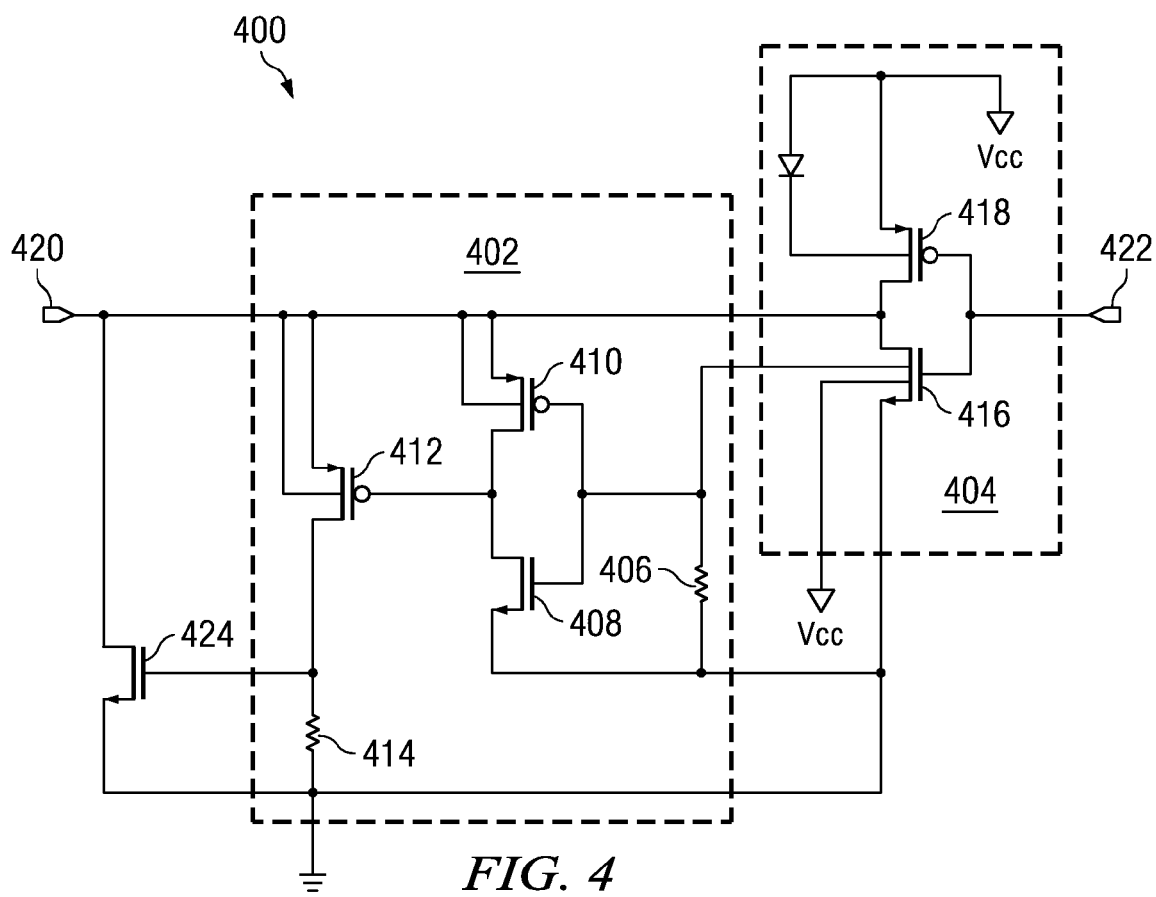
FIG. 4 shows an exemplary integrated circuit.

Turning now to FIG. 4, an exemplary integrated circuit 400 including an exemplary device embodiment is shown. The exemplary integrated circuit 400 includes a circuit 402 and an exemplary integrated circuit device 404 which is protected by the circuit 402. The exemplary integrated circuit device 404 may include an integrated circuit device such as the exemplary integrated circuit device 100. The exemplary integrated circuit device 404 may represent one or more integrated circuits and integrated circuit devices to be protected. The circuit 402 includes but is not limited to a resistor R_SENSE 406, a transistor MN_INV 408, a transistor MP_INV 410, a transistor MP1 412, and a resistor R_PD 414. The exemplary integrated circuit device 404 includes but is not limited to the transistor MN_OUT 416, e.g., an NMOST, and the transistor MP_OUT 418, both of which are operably coupled to a pad 420 and an output 422. The circuit 402 is operably coupled to the pad 420, exemplary integrated circuit device 404, and a transistor ESD_CLAMP 424. Specifically, the gates of the transistors MN_INV 408 and MP_INV 410 and the end of the resistor R_SENSE 406 not connected to the reference voltage (in FIG. 4, ground) are operably coupled to the isolated P-well of the transistor MN_OUT 416. Turning back to FIG. 1, the transistor MN_OUT 416 may be a device such as the integrated circuit device 100 depicted in FIG. 1. In this case, the gates of the transistors MN_INV 408 and MP_INV 410 and the end of the resistor R_SENSE 406 not connected to the reference voltage are operably coupled to the isolated P-well 110, such that when a breakdown current 118 flows in the P-well 110, a current also flows from the P-well 110 to the transistors MN_INV 408 and MP_INV 410 and the end of the resistor R_SENSE 406. The current from the P-well 110 to the resistor R_SENSE 106 continues through the resistor R_SENSE 106 to the reference voltage, creating a voltage across the resistor R_SENSE 106 that indicates the breakdown current 118 in the transistor MN_OUT 416.

During normal operation of the circuit 402, the resistor R_PD 414 holds the gate of the transistor ESD_CLAMP 424 to a low voltage, such that the transistor ESD_CLAMP 424 is off and current from the pad 420 flows to the circuit 402 and exemplary integrated circuit device 404. When an electrical overstress current or voltage spike is input to the pad 420, the transistor ESD_CLAMP 424 clamps or shunts an electrical overstress current or voltage to ground by providing an electrical path from the pad 420 to ground. The transistor ESD_CLAMP 424 provides such a path when a voltage is applied to its gate, allowing current to flow across it from the pad 424 to ground. An electrical overstress current or voltage may include but not be limited to an ESD current or voltage spike. For example, an electrical overstress current or voltage may be cause by a power surge that sends a current or voltage spike to the pad 420. The transistor ESD_CLAMP 424 is not limited to clamping or shunting an ESD current or voltage spike; it may clamp or shunt an electrical overstress current or voltage spike originating in a variety of causes. Those skilled in the art will appreciate that embodiments may include but are not limited to CMOS and bipolar junction integrated circuit devices and applications. The transistor ESD_CLAMP 424 may be but is not limited to a large field-effect transistor ("FET") with a suitable transistor width (e.g., 10,000 μm) or a CMOS transistor.

Figures 5A, 5B, 6:
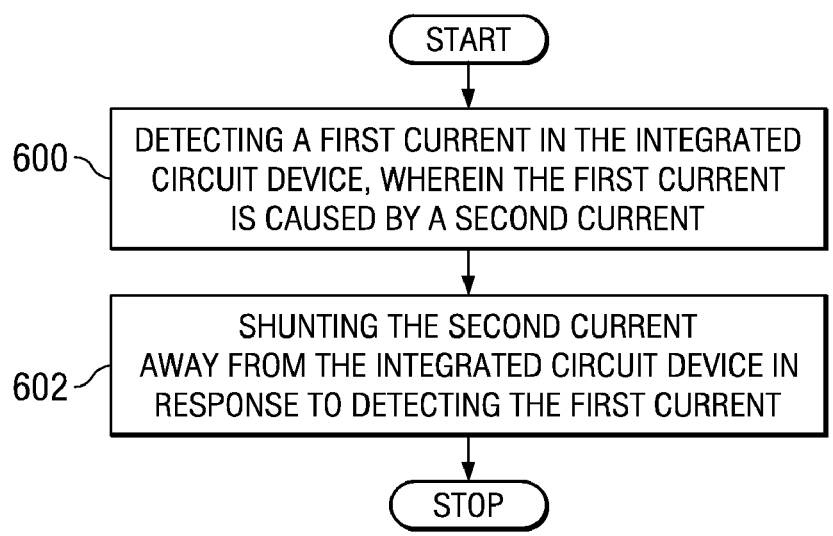
FIG. 5A depicts a table of operating states associated with an embodiment.
FIG. 5B depicts a table of operating states associated with an embodiment.
FIG. 6 depicts high-level logic flowchart of an operational process for protecting an integrated circuit device.

FIG. 5A depicts a table in which the operating states of the transistors of the integrated circuit device 404 and of the circuit 402 in FIG. 4 are shown as functions of the state of the output 422 during normal operation of the exemplary integrated circuit 400. When the output 422 is high, the transistor MP_OUT 418 is off, the transistor MN_OUT 416 is on, the MP_INV 410 is on, the transistor MN_INV 408 is off, the transistor MP1 412 is off, and the transistor ESD_CLAMP 422 is off. When the output 422 is low, the transistor MP_OUT 418 on, the transistor MN_OUT 416 is off, the transistor MP_INV 410 is on, the transistor MN_INV 408 is off, the transistor MP1 412 is off, and the transistor ESD_CLAMP 424 is off.

Where an electrical overstress positive (with respect to ground) voltage spike is applied at the pad 420, this electrical overstress positive voltage spike will force the output transistor MN_OUT 416 into breakdown as described generally in connection with FIG. 1, current will flow into an isolated P-well of the output transistor MN_OUT 416. This will cause current to flow through, and therefore cause a voltage drop across, the resistor R_SENSE 406. The voltage drop across the resistor R_SENSE 406 will provide a high voltage at the gate of the transistor MN_INV 408, turning the transistor MN_INV 408 on. The voltage drop across the resistor R_SENSE 406 will also provide a high voltage at the gate of the transistor MP_INV 410, turning the transistor MP_INV 410 off. This provides a low voltage at the gate of the transistor MP1 412, which turns on the transistor MP1 412. This in turn provides a high voltage to the gate of the transistor ESD_CLAMP 424, turning on the transistor ESD_CLAMP 424. Turning on the transistor ESD_CLAMP 424 provides an electrical path from the pad 420 to the reference voltage, clamping or shunting the electrical overstress voltage spike to the reference voltage, e.g., ground.

A current or voltage spike resulting from an electrical overstress in an integrated circuit device may include but is not limited to an ESD current or voltage spike as described in connection with FIG. 1. An electrical overstress current or voltage spike may also be caused by, e.g., a power surge. The transistor ESD_CLAMP 424 may shunt or clamp a current or voltage spike resulting from electrical overstress; it is not limited to clamping or shunting an ESD current or voltage spike. Those skilled in the art will appreciate that embodiments may include but are not limited to CMOS and bipolar junction integrated circuit devices and applications.

FIG. 5B depicts a table in which the operating states of the integrated circuit device 404 and of the circuit 402 in FIG. 4 are shown during a clamping or shunting of an electrical overstress voltage spike input at the pad 420 of the exemplary integrated circuit 400. When the transistor MN_OUT 416 is in breakdown, the transistor MN_INV 408 is on, the transistor MP_INV 410 is off, the transistor MP1 412 is on, and the transistor ESD_CLAMP 424 is on.

Where an electrical overstress negative (with respect to ground) voltage spike is applied at the pad 420, a parasitic diode of the transistor ESD_CLAMP 424 (the parasitic diode consisting of the P-well and the N-well forming the drain of the transistor ESD_CLAMP 424) will be forward-biased and will handle the negative current flow, protecting the transistor MN_OUT 416.

Returning to FIG. 4, in the circuit 402, the physical widths and lengths of the transistor MN_INV 408 and the transistor MP_INV 410 are critical. When the breakdown voltage Vbd of the transistor MN_OUT 416 is reached, the voltage between the gate of transistor MP_INV 410 and the reference voltage, here ground, will rise rapidly, with the parasitic NPN transistor 120 of the output transistor MN_OUT 416 limiting it to approximately 1 V. The transistor MN_INV 408 turns on, pulling the voltage between the gate of transistor MP_INV 410 and the reference voltage, here ground, down but opposing the effect on this voltage because the second triggering transistor MP_INV 410 is turned on. Therefore, the physical size of the transistor MP_INV 410 must be significantly smaller than the physical size of the transistor MN_INV 408, e.g., an area of the transistor MP_INV 410 of one-fourth the area of the transistor MN_INV 408. Typically, this means that the transistor MN_INV 408 and the transistor MP_INV 410 will have the same width W but the length L of the transistor MP_INV 410 will be one-quarter of the length L of the transistor MN_INV 410.

Turning now to FIG. 6, a high-level logic flowchart of an operational process for protecting an integrated circuit device is shown. The depicted process may include one or more of the following operations: 600 and 602. Operation 600 illustrates detecting a first current in the integrated circuit device, wherein the first current is caused by a second current. Operation 600 may include, for example, detecting a breakdown current 118 in the exemplary integrated circuit device 404 of the exemplary integrated circuit 400. In this example, when an electrical overstress voltage spike is applied to the pad 420, a breakdown current 118 flows in the transistor MP_OUT 416, causing current flow in and a voltage drop across resistor R_SENSE 406. The transistor MN_INV 408, which is off during normal operation, turns on, and the transistor MP_INV 410, which is on during normal operation, turns off. The transistor MP1 412, which is off during normal operation, turns on, completing the sensing of operation 600.

Operation 602 depicts shunting the second current away from the integrated circuit device in response to detecting the first current. Continuing the example begun in the description of operation 600, operation 602 may include, for example, turning on the transistor ESD_CLAMP 424, shunting the electrical overstress voltage spike to ground.

Figure 7:
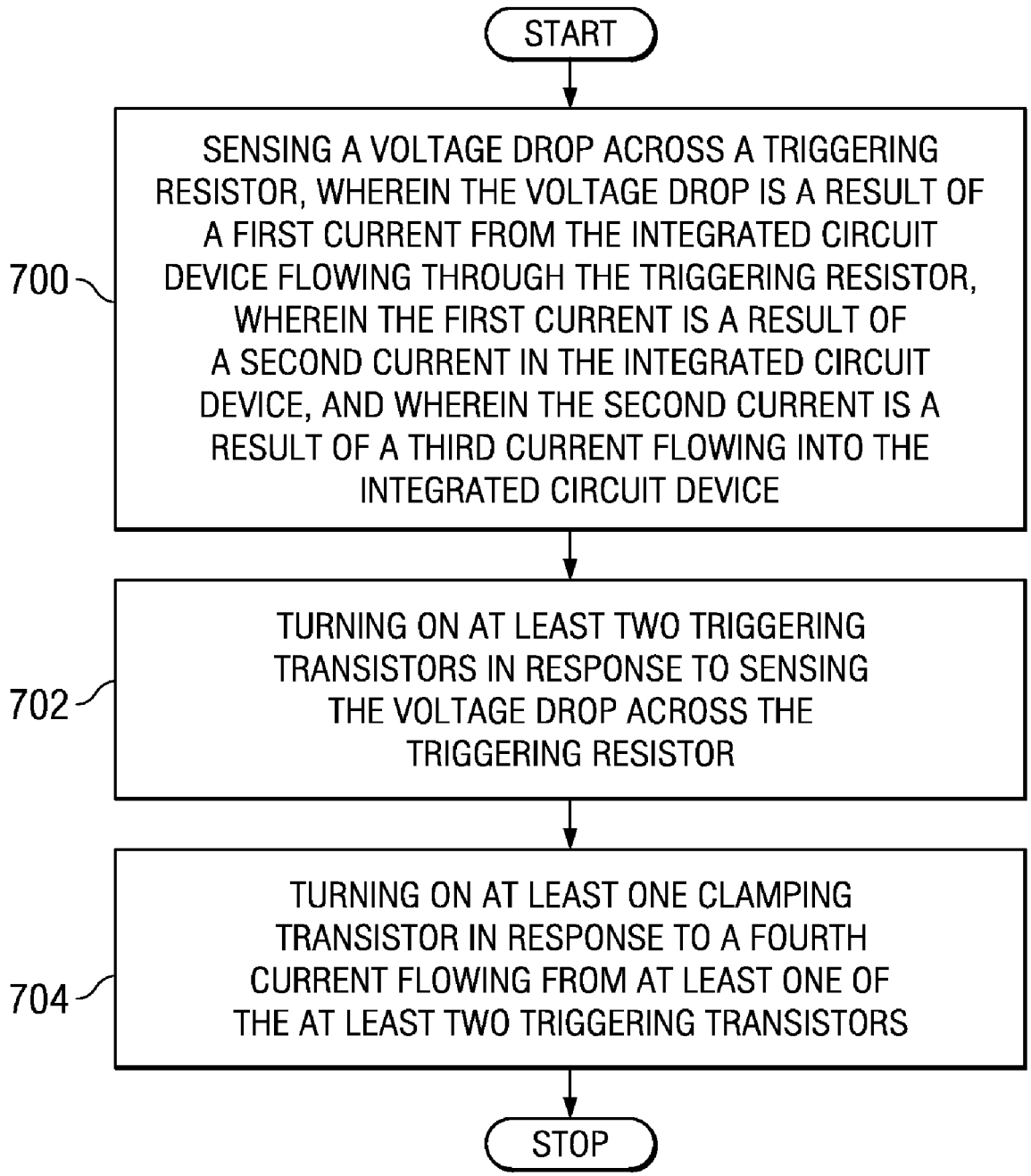
FIG. 7 depicts high-level logic flowchart of an operational process for protecting an integrated circuit device.

Turning now to FIG. 7, a high-level logic flowchart of an operational process for protecting an integrated circuit device is shown. The depicted process may include one or more of the following operations: 700, 702 and 704. Operation 700 shows sensing a voltage drop across a triggering resistor, wherein the voltage drop is a result of a first current from the integrated circuit device flowing through the triggering resistor, wherein the first current is a result of a second current in the integrated circuit device, and wherein the second current is a result of a third current flowing into the integrated circuit device. Operation 700 may include, for example, sensing a breakdown current 118 in the exemplary integrated circuit device 404 of the exemplary integrated circuit 400. In this example, when an electrical overstress voltage spike is applied to the pad 420, a breakdown current 118 flows in the transistor MP_OUT 416, causing current flow in and a voltage drop across the triggering resistor R_SENSE 406.

Operation 702 illustrates turning on at least two triggering transistors in response to sensing the voltage drop across the triggering resistor. Continuing the example begun in the description of operation 700, operation 702 may include, for example, the triggering transistor MN_INV 408, which is off during normal operation, turning on, and the triggering transistor MP_INV 410, which is on during normal operation, turning off. The triggering transistor MP1 412, which is off during normal operation, turns on, completing the turning on of operation 702.

Operation 704 depicts turning on at least one clamping transistor in response to a fourth current flowing from at least one of the at least two triggering transistors. Continuing the example begun in the description of operation 700 and continued in the description of operation 702, operation 704 may include, for example, the turning on of the clamping transistor ESD_CLAMP 424. Turning on the clamping transistor ESD_CLAMP 424 clamps the electrical overstress voltage spike to ground.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus for protecting a circuit comprising:
   a sensing resistor having a first terminal and a second terminal, wherein the first terminal of the resistor is coupled to the circuit;
   a first NMOS transistor that is coupled to the first terminal of the resistor at its source and the second terminal at its drain and its gate;
   a PMOS transistor that is coupled to the first terminal of the resistor at its gate and the second terminal of the resistor at its source; and
   a second NMOS transistor that is coupled to the second terminal of the resistor at its drain, ground at its source, and the drain of the PMOS at its gate.

2. The apparatus of claim 1, wherein the apparatus further comprises a pull-down resistor coupled between the gate of the second NMOS transistor and ground.

3. The apparatus of claim 1, wherein the body of the PMOS transistor is coupled to the second terminal of the resistor.

4. An apparatus for protecting a circuit comprising:

a sensing resistor having a first terminal and a second terminal, wherein the first terminal of the resistor is coupled to the circuit and the second terminal of the resistor is coupled to ground;

a first PMOS transistor that is coupled to the circuit at its source and the first terminal of the resistor at its gate;

a first NMOS transistor that is coupled to the drain of the first PMOS transistor at its drain, the first terminal of the resistor at its gate, and ground at its source;

a second PMOS transistor that is coupled to the circuit at its source and the drains of the first PMOS transistor and the first NMOS transistor at its gate; and a second NMOS transistor that is coupled to the circuit at its drain, ground at its source, and the drain of the second PMOS transistor at its gate.

5. The apparatus of claim 4, wherein the apparatus further comprises a pull-down resistor coupled between the gate of the second NMOS transistor and ground.

6. The apparatus of claim 4, wherein the bodies of the first and second PMOS transistors are each coupled to the circuit.

\* \* \* \* \*